(12) United States Patent
Trivedi et al.

(10) Patent No.: US 12,744,542 B2
(45) Date of Patent: Sep. 22, 2026

(54) SELF-CALIBRATING DIGITAL TO ANALOG CONVERTER

(71) Applicant: NXP USA, Inc., Austin, TX (US)

(72) Inventors: Ronak Prakashchandra Trivedi, Cupertino, CA (US); Hanqing Xing, Cupertino, CA (US); Jean CauXuan Le, Santa Clara, CA (US)

(73) Assignee: NXP USA, Inc., Austin, TX (US)

( * ) Notice: Subject to any disclaimer, the term of this patent is extended or adjusted under 35 U.S.C. 154(b) by 109 days.

(21) Appl. No.: 18/965,059

(22) Filed: Dec. 2, 2024

(65) Prior Publication Data

US 2025/0202494 A1 Jun. 19, 2025

(30) Foreign Application Priority Data

Dec. 18, 2023 (EP) .................................... 23217689

(51) Int. Cl.
*H03M 1/10* (2006.01)
*H03M 1/06* (2006.01)

(52) U.S. Cl.
CPC ....... *H03M 1/1038* (2013.01); *H03M 1/1071* (2013.01); *H03M 1/06* (2013.01); *H03M 1/1023* (2013.01); *H03M 1/1028* (2013.01)

(58) Field of Classification Search
CPC .... H03M 1/1023; H03M 1/1028; H03M 1/06; H03M 1/78; H03M 1/68
See application file for complete search history.

(56) References Cited

U.S. PATENT DOCUMENTS 11,356,111 B1 * 6/2022 Xing .................... H03M 1/785
2023/0223947 A1 7/2023 Trivedi et al.

* cited by examiner

*Primary Examiner* — Joseph J Lauture

(57) ABSTRACT

The disclosure relates to self-calibration of non-linearity in a digital to analog converter (DAC). Example embodiments include a method for calibrating non-linearity of a segmented non-binary DAC in a self-calibrating DAC system, the method comprising: providing first calibration input digital signals to a thermometric weighted segment and measuring first outputs of the DAC with an ADC; providing second calibration input digital signals to the thermometric weighted segment and measuring second outputs of the DAC with the ADC; calculating a first scaling factor for first switches and resistive elements by dividing each of the second outputs of the DAC by a difference between adjacent ones of the first outputs of the DAC; calculating a second scaling factor for second switches from a sum of the first outputs of the DAC divided by a measured output range of the DAC; and storing the first and second scaling factors in a memory module.

20 Claims, 8 Drawing Sheets

100
0xFFFFF
0x00000
0x00001
0x00002
0x00004
0x00008
0x00010
0x02000
0x04000
0x08000
0x10000
0x20000
0x40000
0x80000
122
DAC CODE OUPUT MUX
Cal_ctrl
116
1
0
118
Cal_ctrl
Non-Binary DAC
120
124
126
ADC INMUX
Cal_ctrl
From External Source
Modulator
102
Digital Filter
104
DAC I/O
114
D_in
Conversion Module
112
DAC Weights Coeffs. Memory
110
Offset & Gain Correction Memory
108
DAC Weightage Generator
107
Auto Calibration Controller
106

SELF-CALIBRATING DIGITAL TO ANALOG CONVERTER

CROSS-REFERENCE TO RELATED APPLICATIONS

This application claims priority under 35 U.S.C. § 119 to European patent application no. 23217689.1, filed Dec. 18, 2023, the contents of which are incorporated by reference herein.

FIELD

The disclosure relates to self-calibration of non-linearity in a digital to analog converter (DAC).

BACKGROUND

A digital to analog converter (DAC) is a circuit that converts a digital signal into an analog signal. An analog to digital converter (ADC) performs the reverse function. A high precision transceiver system typically includes both a high-resolution DAC and a high-resolution ADC. Current industrial input/output transceivers typically require an accuracy of approximately 16 bits for transmission and greater than 20 bits for reception, with both paths typically integrated onto a single chip.

For reception, a sigma-delta modulator ADC is commonly used because of its high resolution and inherent linearity. Additionally, the noise level of a sigma-delta modulator can be easily regulated by increasing its over-sampling ratio. This means there are minimal calibration and trimming requirements for the ADC of a high precision transceiver.

For transmission, a highly linear DAC is required to provide accurate output signals for each digital input voltage level. However, high accuracy DACs are difficult to implement and generally involve high accuracy analog trimming procedures, which increases cost. Any resistor elements present in the DAC architecture may have first and second order voltage coefficients. These voltage coefficients in a resistor-based DAC can introduce significant non-linearities in the DAC transfer curve, especially at accuracy levels of 18 bits or greater. A general problem therefore is how to improve the linearity of a high precision DAC.

SUMMARY

According to a first aspect there is provided a method for calibrating non-linearity of a segmented non-binary DAC in a self-calibrating DAC system, the segmented non-binary DAC having a thermometric weighted segment having a first plurality of switches and resistive elements controllable by a most significant plurality of bits of a digital input signal and a sub-binary weighted segment having a second plurality of switches and resistive elements controllable by a least significant plurality of bits of the digital input signal, the method comprising:

- providing a first cumulative series of calibration input digital signals to the thermometric weighted segment and measuring a corresponding first series of outputs of the DAC with an ADC;
- providing a second non-cumulative series of calibration input digital signals to the thermometric weighted segment and measuring a second series of outputs of the DAC with the ADC;
- calculating a first scaling factor for the first plurality of switches and resistive elements by dividing each of the second series of outputs of the DAC by a difference between adjacent ones of the first series of outputs of the DAC;
- calculating a second scaling factor for the second plurality of switches from a sum of the first series of outputs of the DAC divided by a measured output range of the DAC; and
- storing the first and second scaling factors in a memory module of the self-calibrating DAC system for applying to a digital input during normal operation of the DAC system.

The first scaling factor rsc1<i> may be calculated as:

$$rsc1\langle i\rangle = \frac{Wnc\langle i+1\rangle}{W\langle i+1\rangle - W\langle i\rangle}$$

where $W_{nc}$<i> is an output measuring a non-cumulative weight of element i of the thermometric weighted segment, $W\langle i\rangle$ is an output measuring a cumulative weight of i elements of the thermometric weighted segment, and i ranges from 1 to $N_{th}$, where $N_{th}$ is the first plurality of switches.

The second scaling factor rsc2 may be calculated as:

$$rsc2 = \frac{\sum_{i=1}^{Nb} Wi}{DAC_{FS} - DAC_{ZS} - W_{Nth}}$$

where Nb is a resolution of the sub-binary weighted segment of the DAC, $DAC_{ZS}$ is a zero scale output of the DAC, $DAC_{FS}$ is a full scale output of the DAC and $W_{Nth}$ is an output of the DAC with all $N_{th}$ switches of the thermometric segment closed.

The first cumulative series of calibration input digital signals may be provided to the thermometric weighted segment while maintaining the least significant plurality of bits of the digital input signal at a constant value.

The second non-cumulative series of calibration input digital signals may be provided to the thermometric weighted segment while maintaining the least significant plurality of bits of the digital input signal at a constant value.

The constant value in either case may be zero.

The method may further comprise, during normal operation of the DAC system:

- applying the first and second scaling factors to an input digital signal to provide a converted input digital signal;
- providing the converted input digital signal to the segmented non-binary DAC; and
- providing an output analog signal from the segmented non-binary DAC.

The first and second scaling factors may be applied to the input digital signal using a successive approximation register.

According to a second aspect there is provided a self-calibrating DAC system comprising:

- a segmented non-binary DAC having a thermometric weighted segment having a first plurality of switches and resistive elements controllable by a most significant plurality of bits of a digital input signal and a sub-binary weighted segment having a second plurality of switches and resistive elements controllable by a least significant plurality of bits of the digital input signal;

an ADC configured to selectively receive an output from the DAC;

a memory module;

an input code conversion module configured to apply a scaling factor stored in the memory module to a digital input during normal operation of the DAC system; and a calibration controller configured to:

provide a first cumulative series of calibration input digital signals to the thermometric weighted segment and measure a corresponding first series of outputs of the DAC with the ADC;

provide a second non-cumulative series of calibration input digital signals to the thermometric weighted segment and measure a second series of outputs of the DAC with the ADC;

calculate a first scaling factor for the first plurality of switches and resistive elements by dividing each of the second series of outputs of the DAC by a difference between adjacent ones of the first series of outputs of the DAC;

calculate a second scaling factor for the second plurality of switches from a sum of the first series of outputs of the DAC divided by a measured output range of the DAC;

store the first and second scaling factors in the memory module.

The calibration controller may be configured to calculate the first scaling factor rsc1<i> from:

$$rsc1\langle i\rangle = \frac{Wnc\langle i+1\rangle}{W\langle i+1\rangle - W\langle i\rangle}$$

where $W_{nc}$<i> is an output measuring a non-cumulative weight of element i of the thermometric weighted segment, $W\langle i\rangle$ is an output measuring a cumulative weight of i elements of the thermometric weighted segment, and i ranges from 1 to $N_{th}$, where $N_{th}$ is the first plurality of switches.

The calibration controller may be configured to calculate the second scaling factor rsc2 from:

$$rsc2 = \frac{\sum_{i=1}^{Nb} Wi}{DAC_{FS} - DAC_{ZS} - W_{Nth}}$$

where $N_{th}$ is the first plurality of switches, Nb is a resolution of the sub-binary weighted segment of the DAC, $DAC_{ZS}$ is a zero scale output of the DAC, $DAC_{FS}$ is a full scale output of the DAC and $W_{Nth}$ is an output of the DAC with all $N_{th}$ switches of the thermometric segment closed.

The calibration controller may be configured to provide the first cumulative series of calibration input digital signals to the thermometric weighted segment while maintaining the least significant plurality of bits of the digital input signal constant.

The calibration controller may be configured to provide the second non-cumulative series of calibration input digital signals to the thermometric weighted segment while maintaining the least significant plurality of bits of the digital input signal constant.

The input code conversion module may be configured to apply the first and second scaling factors to the input digital signal using a successive approximation register.

According to a third aspect there is provided a computer program comprising instructions to cause a computer processor to perform the method according to the first aspect.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a non-transitory computer readable medium, which may be a physical computer readable medium, such as a disc or a memory device, or may be embodied as a transient signal. Such a transient signal may be a network download, including an internet download.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
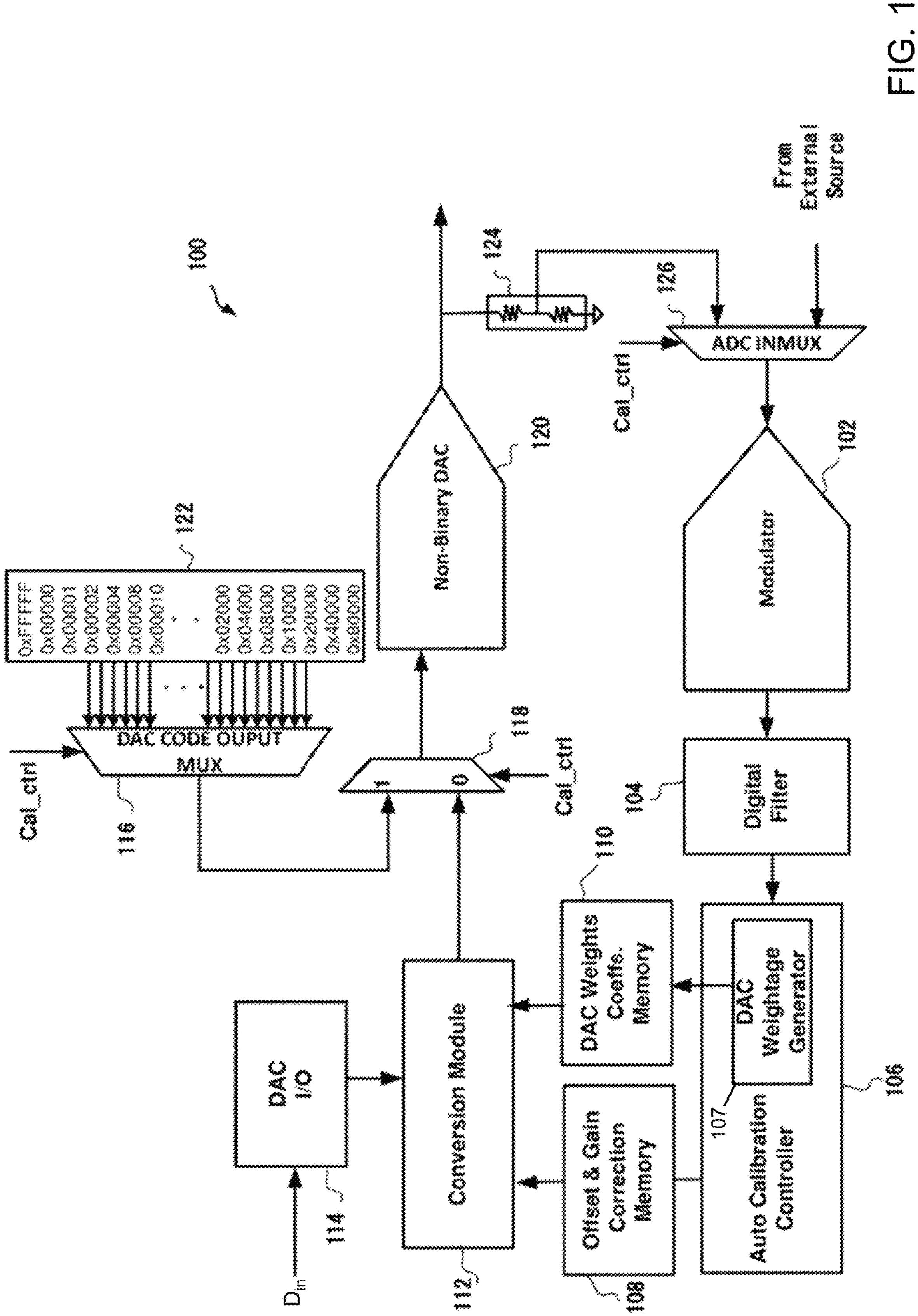
FIG. 1 is a schematic diagram of a self-calibrating DAC system.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 is a schematic diagram of an example self-calibrating DAC 100, as disclosed in U.S. Pat. No. 11,356,111B1. The system 100 is fabricated on a common IC with an on-chip loopback system for self-calibration. The system 100 includes a high-precision segmented non-binary DAC 120 in an output path and an ADC comprising a sigma-delta modulator 102 and digital filter 104 in an input path. The digital filter 104 is arranged to receive and filter an output of the sigma-delta modulator 102. The digital filter 104 provides an output signal to an auto calibration controller 106, which incorporates a DAC weightage generator 107. A DAC weights coefficients memory 110 stores DAC weights generated by the DAC weightage generator 107. An offset & gain correction memory 108 stores offset & gain correction coefficients generated by the auto calibration controller 106. The DAC weights coefficient memory 110 and the offset & gain correction coefficients memory 108 may be implemented as a single module. A conversion module 112 generates a raw DAC input code based on outputs from the auto calibration controller 106 and an external input digital signal $D_{in}$ through a DAC input/output (I/O) port 114.

The sigma-delta modulator 102 receives an analog input signal via an input multiplexer ADC INMUX 126. The input multiplexer 126, controlled by a calibration control signal Cal_ctrl, enables an output from the non-binary DAC 120 to be provided to the ADC during a calibration mode and from an external source during a normal operation mode.

A buffer or lookup table 122 stores calibration codes for providing to the DAC 120 during the calibration mode. A DAC code output multiplexer 116 receives inputs from the lookup table 122 and outputs a selected one of the calibration codes when the calibration control signal is enabled. The calibration code is input to a DAC input multiplexer 118 that passes the calibration code to the DAC 120 when the calibration control signal is enabled and passes an output from the conversion module 112 to the DAC 120 otherwise.

The lookup table 122 includes pre-configured digital calibration codes for which expected analog outputs (after the input calibration code is converted to an analog output by the non-binary DAC 120) is known. During the calibration mode, the auto calibration controller 106 generates non-binary DAC weightages by applying the digital codes stored in the lookup table 122. The auto calibration controller 106 also generates offset and gain correction coefficients for the non-binary DAC input bits. The generated weightages and coefficients are stored in the memory 108, 110 and used to calibrate the digital inputs to the non-binary DAC 120 during the normal mode.

During the calibration phase, the outputs of the non-binary DAC 120 are sent back to the input of the modulator 102 through a level-shifter 124. The level-shifter 124 ensures that the full DAC output range is within the input range of the modulator 102. The ADC multiplexer 126 enables selection of the input signals between an internal DAC output and an external analog input.

The calibration process is controlled by the auto calibration controller 106. During the calibration, the DAC input multiplexer 118 selects DAC calibration codes from the lookup table 122. Sequentially, the non-binary DAC 120 generate outputs of its zero-scale output, full-scale output, and each bit weight from least significant bit (LSB) to most significant bit (MSB) by enabling the corresponding calibration code in the lookup table 122. The DAC outputs are used by the modulator 102 and digital filter 104 to generate weight coefficients and offset & gain coefficients.

Figure 2:
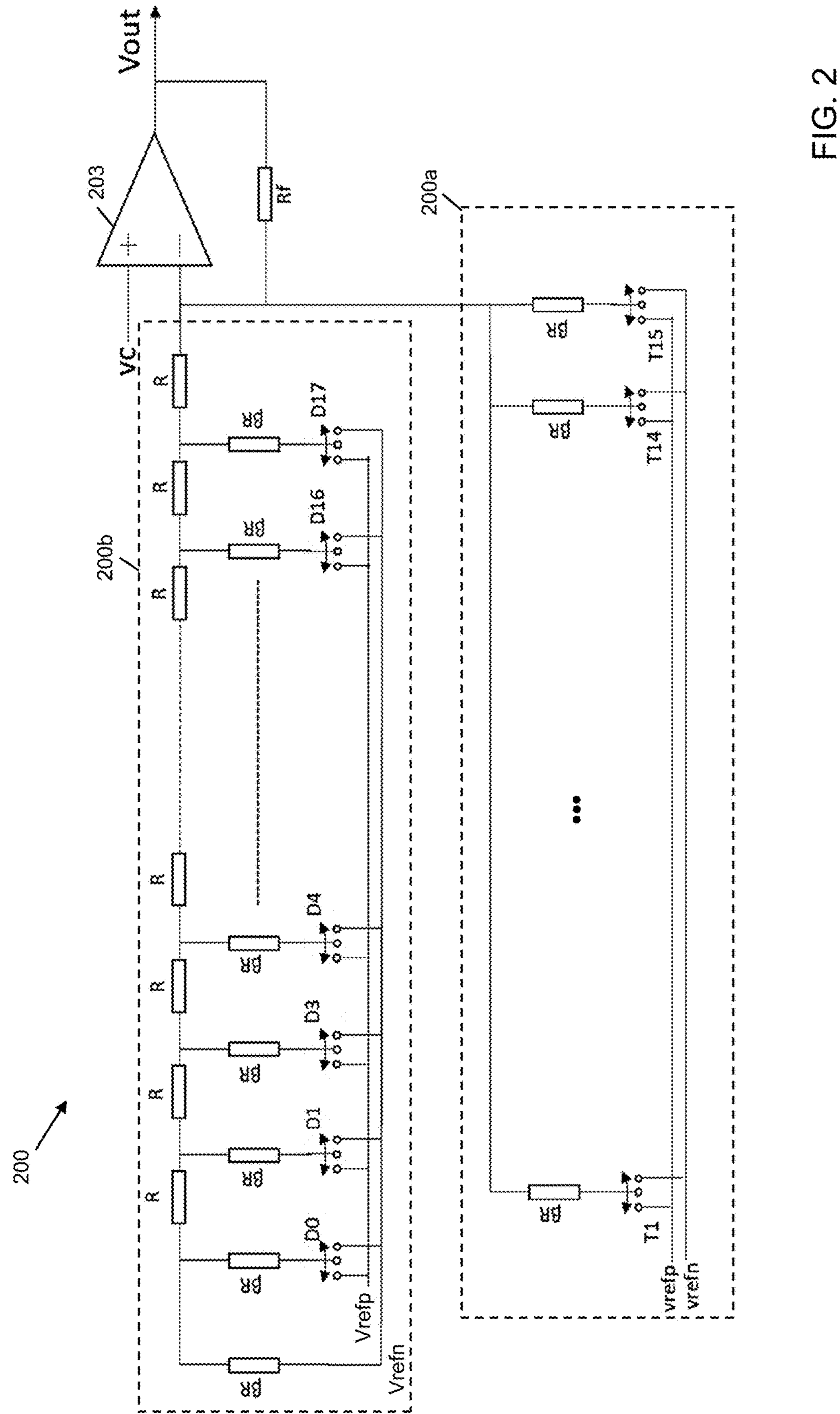
FIG. 2 is a schematic diagram of an example segmented non-binary DAC.

FIG. 2 is a schematic diagram of an example segmented non-binary DAC 200 that may be used as the non-binary DAC 120 of FIG. 1. The DAC 200 converts an n bit digital input code $D_{in}$ into an analog output voltage Vout. The DAC 200 comprises first and second segments 200*a*, 200*b* and an amplifier 203. The first segment 200*a* is a thermometric weighted segment 200*a* having a first plurality of switches T1-T15 and resistive elements βR controllable by a most significant plurality of bits of a digital input signal $D_{in}$. The second segment 200*b* is a sub-binary weighted segment 200*b* having a second plurality of switches D0-D17 and resistive elements βR, R controllable by a least significant plurality of bits of the digital input signal $D_{in}$ The weightage ratio β between the resistor values βR, R is greater than 2, making the second segment 200*b* a sub-binary weighted segment.

Switches D0-D17 control whether a positive reference voltage Vrefp or a negative reference voltage Vrefn is provided to each of the corresponding resistive elements of the second segment 200*b*. The positive reference Vrefp may be controlled via a reference buffer present on the self-calibrating DAC system 100. This has the effect of reducing code dependent voltage drop and hence reducing the INL of the DAC transfer curve. The negative reference voltage Vrefn may be connected to a ground terminal to save power. The outputs of the first and second segments 200*a*, 200*b* are combined at an inverting input of the amplifier 203, which has a gain regulated by feedback resistor $R_f$.

The DAC 200 produces a weighted sum output Vout, with the weights set by the switches D0-D17 and T1-T15 in combination with the resistive values of the resistive elements βR of the thermometric weighted segment 200*a* and the sub-binary weighted segment 200*b* contributing a different "weighted" amount to the analog output signal Vout. This means the analog output signal Vout is equal to the bit weightage associated with a given input code $D_{in}$. To achieve a desired resolution (e.g., to cover the DAC output range with configurable steps), redundancy is introduced by having bit weightage ratio of the non-binary segment 200*b* of two successive bits less than 2, i.e. with the ratio β>2. The lower the weightage ratio is, the more redundancy (output overlapping) in the DAC 200 is obtained. With the same level of redundancy, the achievable calibrated resolution increases with the resolution of the raw DAC 200.

Separating the DAC 200 into first and second segments 200*a*, 200*b* reduces the impact of a finite switch-on resistance of the first and second plurality of switches T1-T15, D0-D17. When measuring in calibration mode, any mismatch between resistance of the first and second plurality of switches D0-D17, T1-T15 in a closed state versus an open state contributes to INL in the transfer curve of the DAC 200. Furthermore, any temperature drift in switch-on resistance of switches D0-D17, T1-T15 causes a proportionate drift in INL. An alternative solution is to implement resistive elements βR, R and feedback resistor Rr as thin film resistors, reducing their voltage coefficients. However, this increases manufacturing costs and is incompatible with certain CMOS processes. This means that resistive elements βR, R and feedback resistor $R_f$ are more commonly implemented as polysilicon resistors. However, the voltage coefficients of polysilicon resistors can introduce significant non-linearity in the DAC 200 transfer curve, especially at higher accuracy levels of, for example, 18 bits or greater.

The self-calibration scheme described in U.S. Pat. No. 11,356,111B1 can compensate for the nonlinear voltage coefficients caused by the resistive elements βR in the thermometric weighted segment 200*a* but not for voltage coefficients caused by resistive elements in the non-binary weighted segment 200*b*. In addition, the feedback resistor $R_f$ connected to the amplifier 203 introduces significant non-linear gain variation caused by the voltage coefficient of $R_f$, which is not compensated for by the self-calibration scheme of U.S. Pat. No. 11,356,111B1.

Figure 3:
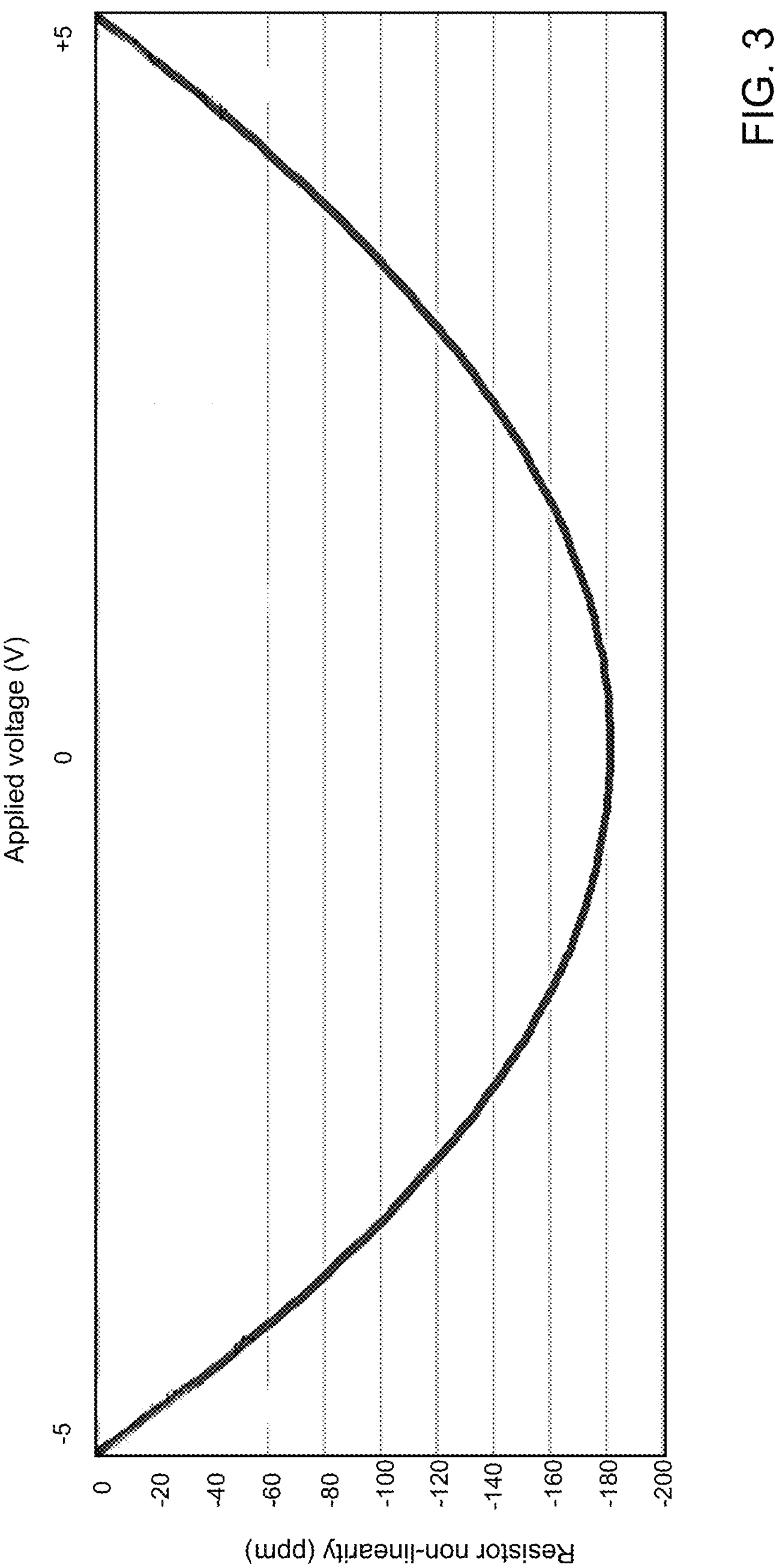
FIG. 3 is an example plot of non-linearity of a polysilicon resistor as a function of applied voltage.
Figure 4:
FIG. 4 is an example plot of integral non-linearity (INL) as a function of digital input code $D_{in}$ for the self-calibrating DAC system of FIG. 1 using polysilicon resistors.
Figure 4:
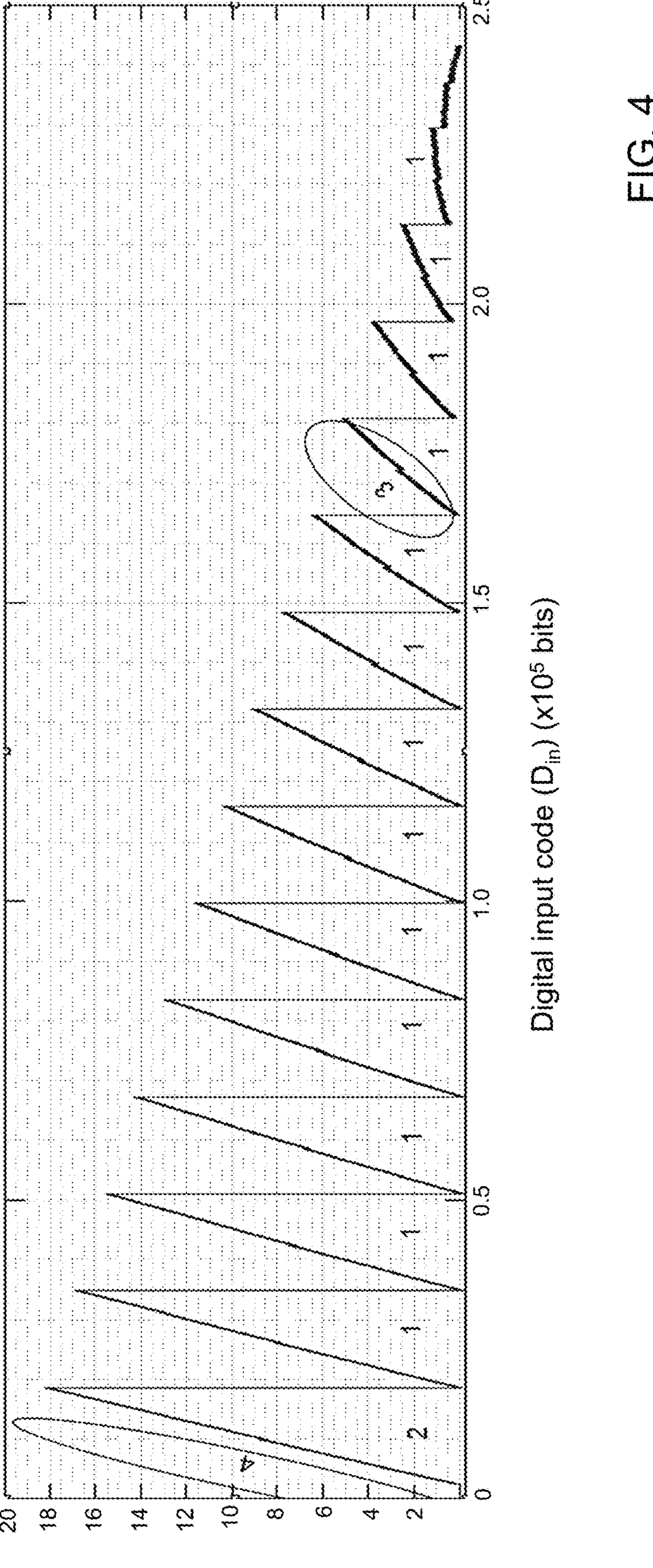

FIG. 3 illustrates a plot of variation in resistance as a function of applied voltage for an example polysilicon resistor that may be used for the resistive elements βR, R, $R_f$ of the DAC 200. The resistance varies by up to around 180 ppm across the voltage range, which contributes to non-linearities in the DAC transfer curve. FIG. 4 illustrates an example plot of INL as a function of digital input code $D_{in}$ for a DAC comprising such polysilicon resistors. Four distinct non-linear regions, labelled 1-4 in FIG. 4, correspond to different types of gain error. Region 1 corresponds to a first gain error from the feedback resistor $R_f$ due to switching segments in thermometric section 200*a*. Region 2 corresponds to a second gain error from the feedback resistor when all thermometric bits are high. Region 3 corresponds to a third gain error from the feedback resistor when non-binary bits switch within one thermometric segment. Region 4 corresponds to a fourth gain error from the feedback resistor in the output range between full scale and when all thermometric bits are high. One or more of these gain errors can be calibrated for using a self-calibration scheme of the type described below.

Figure 5:
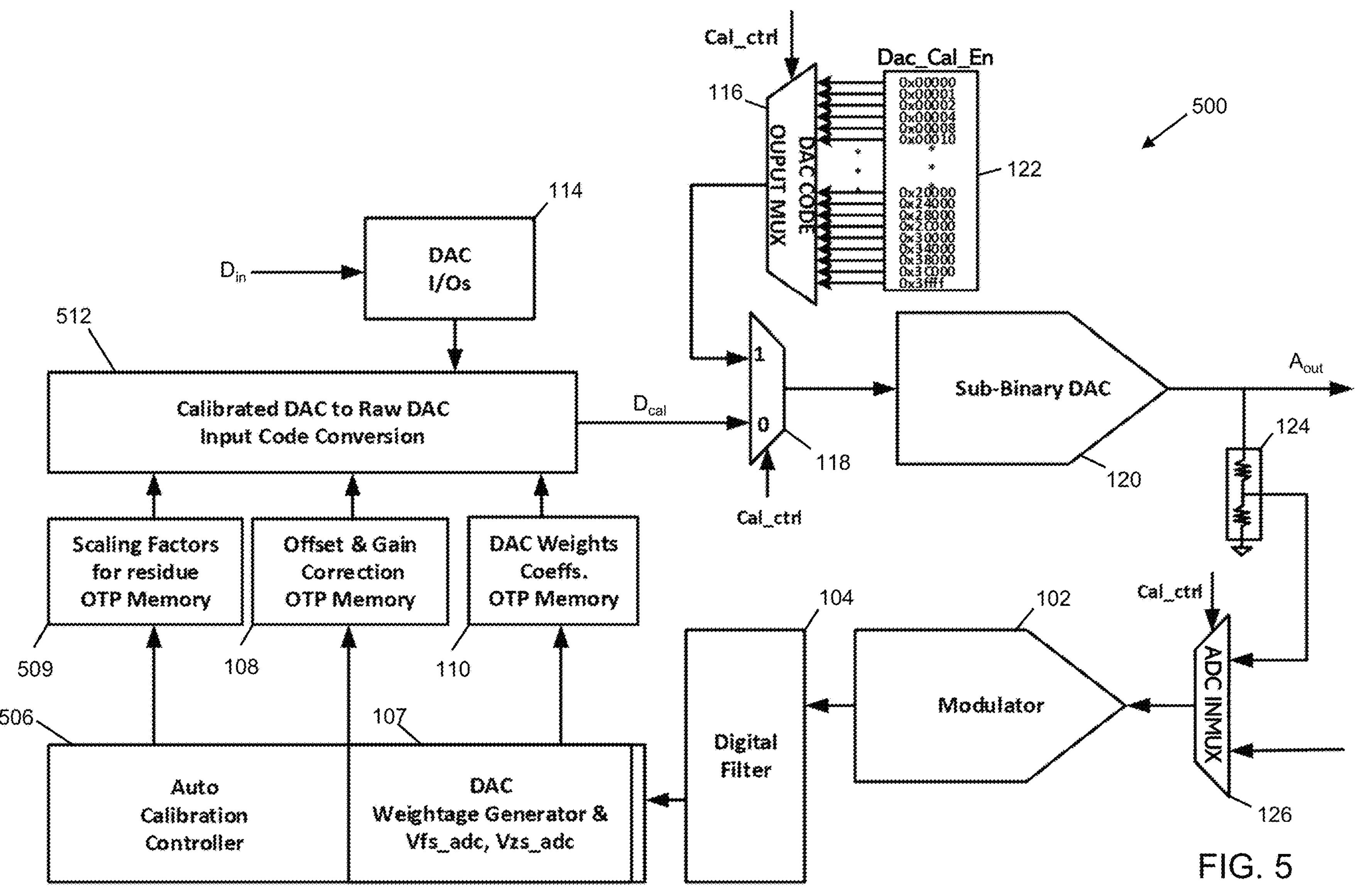
FIG. 5 is a schematic diagram of an example self-calibrating DAC system.

FIG. 5 is a schematic diagram of an example self-calibrating DAC system 500. The system 500 comprises all the features of the system 100 of FIG. 1, as indicated by corresponding reference signs. The calibration controller 506 is, however, further configured to operate to carry out additional calibration sequences as described below, an additional memory element 509 is provided for storing scaling factors, and the conversion module 512 is configured to use the stored scaling factors during normal operation of the system 500.

As with the system 100 of FIG. 1, the DAC 120 is a segmented DAC of the type described above in relation to FIG. 2, which comprises a thermometric weighted segment 200*a* having a first plurality of switches T1-T15 and resistive elements βR controllable by a most significant plurality of bits of a digital input signal $D_{in}$ and a sub-binary weighted segment 200*b* having a second plurality of switches D0-D17 and resistive elements βR, R controllable by a least significant plurality of bits of the digital input signal $D_{in}$.

Figure 6:
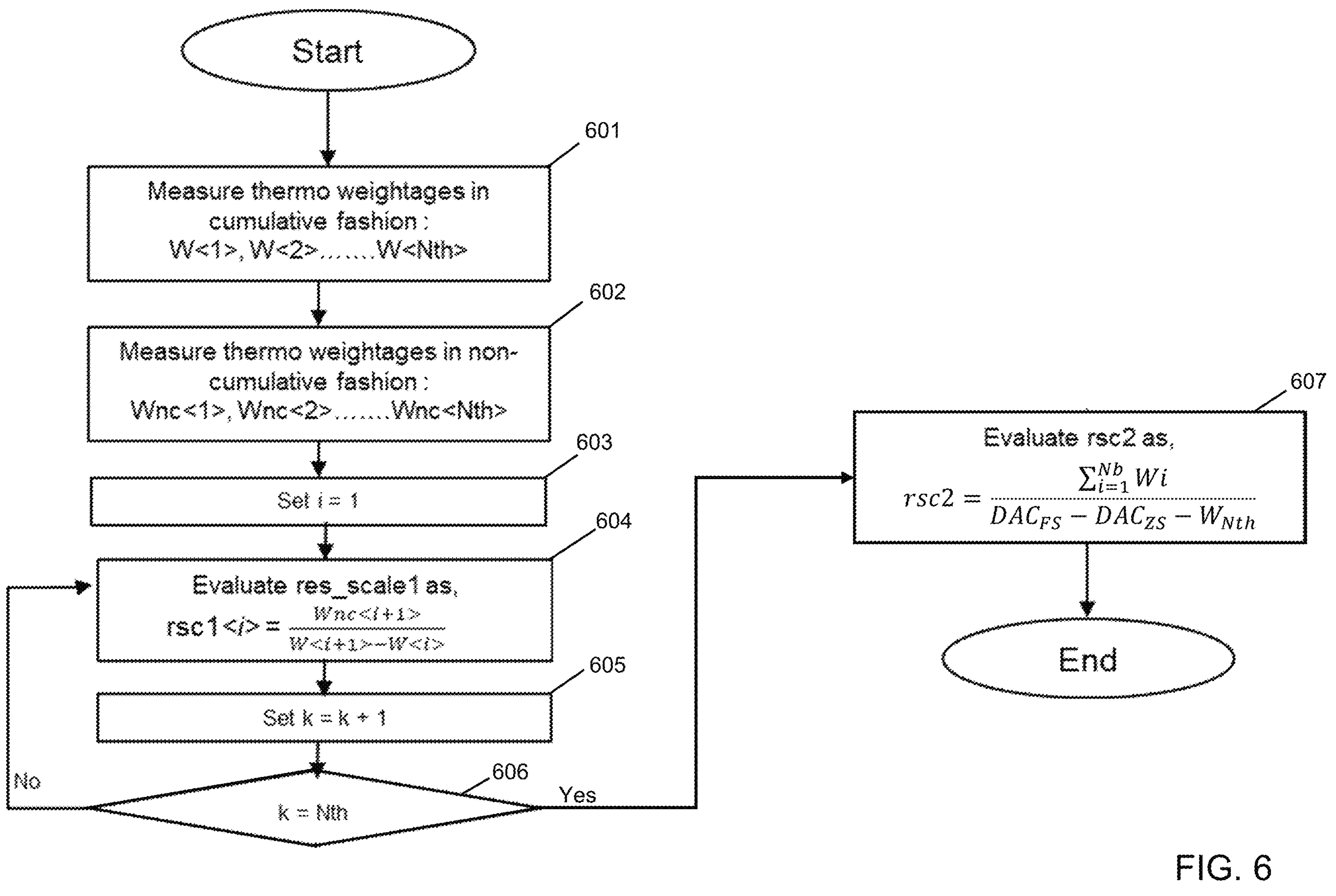
FIG. 6 is a flow diagram of an example method for measuring weightages and scaling factors of the segmented non-binary DAC of FIG. 5.

FIG. 6 illustrates a calibration process performed by the calibration controller 506 to provide first and second scaling factors rsc1, rsc2 for the DAC 120. The first and second scaling factors correct for gain errors in regions 1 and 2 illustrated in FIG. 4. In step 601, the calibration controller 506 provides a first cumulative series of calibration input digital signals to the thermometric weighted segment 200*a* and measures a corresponding first series of outputs W<n> of the DAC with the ADC 102, 104. In step 602, the calibration controller 506 provides a second non-cumulative series of calibration input digital signals to the thermometric weighted segment 200*a* and measures a second series of outputs $W_{nc}$<n> of the DAC with the ADC 102, 104.

Table 1 below illustrates an example sequence of inputs for the thermometric and sub-binary segments for each of the cumulative outputs W<i> for the example 22 bit DAC 200 having 15 thermometric bits and 18 sub-binary bits. In each case, the sub-binary segment inputs are held at zero. However, it is also possible to have sub-binary segment inputs held at non-zero.

TABLE 1

Example sequence of inputs for cumulative outputs.

| Output | Thermometric segment bits | Sub-binary segment bits |
|---|---|---|
| W<1> | 0000 0000 0000 001 | 0000 0000 0000 0000 00 |
| W<2> | 0000 0000 0000 011 | 0000 0000 0000 0000 00 |
| W<3> | 0000 0000 0000 111 | 0000 0000 0000 0000 00 |
| . . . | . . . | . . . |
| W<15> | 1111 1111 1111 111 | 0000 0000 0000 0000 00 |

Table 2 below illustrates an example sequence of inputs for the thermometric and sub-binary segments for each of the non-cumulative outputs $W_{nc}$<i> for the example DAC 200. Again, in each case the sub-binary bits are held at zero. Here also, it is also possible to have sub-binary segment inputs held at non-zero.

TABLE 2

Example sequence of inputs for non-cumulative outputs.

| Output | Thermometric segment bits | Sub-binary segment bits |
|---|---|---|
| $W_{nc}$<1> | 0000 0000 0000 001 | 0000 0000 0000 0000 00 |
| $W_{nc}$<2> | 0000 0000 0000 010 | 0000 0000 0000 0000 00 |
| $W_{nc}$<3> | 0000 0000 0000 100 | 0000 0000 0000 0000 00 |
| . . . | . . . | . . . |
| $W_{nc}$<15> | 1000 0000 0000 000 | 0000 0000 0000 0000 00 |

Table 3 below illustrates an example sequence of inputs for determining all sub-binary weightages in the sub-binary segment of the DAC 200 of FIG. 2.

TABLE 3

Example sequence of inputs for calculating sub-binary weightages.

| Output | Thermometric segment bits | Sub-binary segment bits |
|---|---|---|
| W<16> | 0000 0000 0000 000 | 0000 0000 0000 0000 01 |
| W<17> | 0000 0000 0000 000 | 0000 0000 0000 0000 10 |
| W<18> | 0000 0000 0000 000 | 0000 0000 0000 0000 00 |
| . . . | . . . | . . . |
| W<33> | 0000 0000 0000 000 | 1000 0000 0000 0000 00 |

The scaling factor is calculated for region 1 of FIG. 4 using the thermometric segment weightages, while the scaling factor for region 2 is calculated using sub-binary weightages and the final thermometric weightage W<15>.

In steps 603-606 the calibration controller 506 calculates the first scaling factor rsc1<i> for the first plurality of switches T1-T15 and resistive elements βR by, for each value of i, dividing each of the second series of outputs $W_{nc}$<n> of the DAC 200 by a difference between adjacent ones of the first series of outputs W<n> of the DAC 200. In the example in FIG. 6, rsc1<i> is calculated from:

$$rsc1\langle i\rangle = \frac{Wnc\langle i+1\rangle}{W\langle i+1\rangle - W\langle i\rangle}$$

where $W_{nc}$<i> is an output measuring a non-cumulative weight of i elements of the thermometric weighted segment 200*a*, W⟨i⟩ is an output measuring a cumulative weight of i elements of the thermometric weighted segment 200*a*, and i ranges from 1 to $N_{th}$, where Nin is the first plurality of switches T1-T15. In the example DAC 200 of FIG. 2, the value $N_{th}$ is 15.

In step 607 the calibration controller 506 calculates the second scaling factor rsc2 for the second plurality of switches D0-D17 from a sum of the first series of outputs W<n> of the DAC 200 divided by a measured output range of the DAC 200. In the example of FIG. 6, rsc2 is calculated from:

$$rsc2 = \frac{\sum_{i=1}^{Nb} Wi}{DAC_{FS} - DAC_{ZS} - W_{Nth}}$$

where Nb is a resolution of the sub-binary weighted segment 200*b*, $DAC_{ZS}$ is a zero scale output of the DAC 200, $DAC_{FS}$ is a full scale output of the DAC 200 and $W_{Nth}$ is an output of the DAC 200 with all $N_{th}$ switches of the thermometric segment (200*a*) closed.

Following calculation of the first and second scaling factors, the calibration controller stores rsc1<i> and rsc2 in the memory module 509. The conversion module 512 then applies the scaling factors to a digital input code $D_{in}$ during normal operation of the self-calibrating DAC system 500.

During normal operation of the DAC system 500, the conversion module 512 applies the first and second scaling factors rsc1<i>, rsc2 stored in the memory module 509 to an input digital signal $D_{in}$ to provide a converted input digital signal $D_{cal}$; and provide the converted input digital signal $D_{cal}$ to the segmented non-binary DAC 200, wherein the non-binary DAC 200 is configured to provide an analog output signal $A_{out}$.

Figure 7:
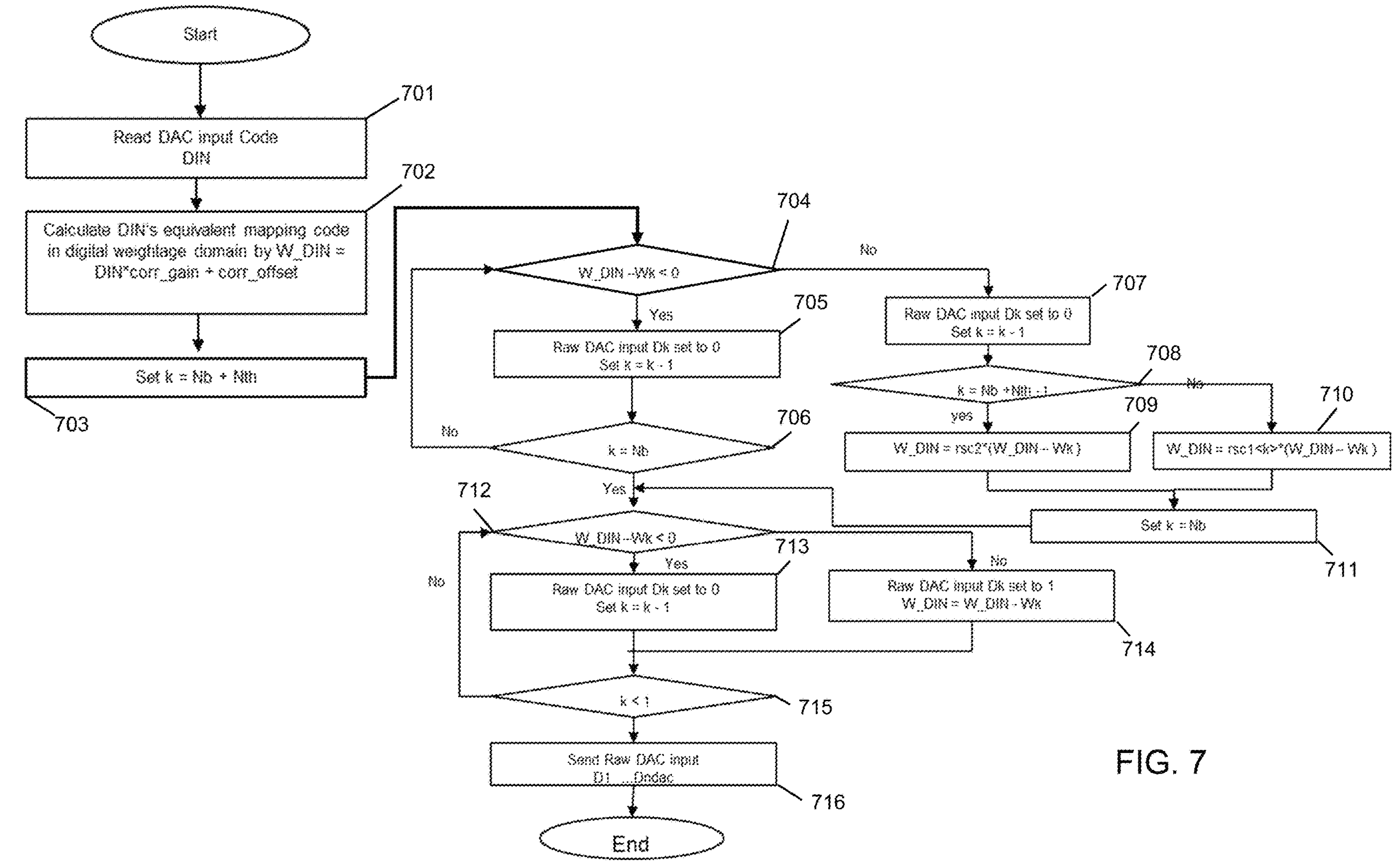
FIG. 7 is a flow diagram of an example method for applying a scaling factor to a digital input code during normal operation of the self-calibrating DAC system of FIG. 5.

During normal operation, the conversion module 512 may apply the first and second scaling factors rsc1<i>, rsc2 as scaling factors to the input digital signal $D_{in}$ using a successive approximation register (SAR) method, an example of which is illustrated in FIG. 7. In step 701, a DAC input code $D_{in}$ is provided to the DAC I/O port 114. In step 702, the conversion module 512 applies gain and offset correction coefficients corr_gain, corr_offset to $D_{in}$, for example according to the self-calibrating DAC system 100 disclosed in U.S. Pat. No. 11,356,111B1, to provide $W_{DIN}$, where $W_{DIN}=D_{IN}$*corr_gain+corr_offset. In step 703, a counter k is set to $N_b+N_{th}$ where $N_b$ is the total number of bits of the sub-binary segment 200*b* and $N_{th}$ is the total number of bits of the thermometric segment 200*a*.

In step 704, if a gain residue for the kth element given by $W_{DIN}-W_k$ is less than 0, the method proceeds to steps 705 where the DAC input $D_k$ is set to 0 and the counter k decremented. Step 706 causes the process to return to step 704 until $k=N_b$. The method then proceeds to step 712.

If, at step 704, the gain residue $W_{DIN}-W_k$ is not less than 0, the method proceeds to step 707 where the DAC input $D_k$ is set to 0 and the counter k decremented. If, at step 708, k is equal to $N_b+N_{th}-1$, the second scaling factor rsc2 is applied by multiplying the gain residue by rsc2, such that $W_{DIN}=\text{rsc2}*(W_{DIN}-W_k)$. If, at step 708, k is not equal to $N_b+N_{th}-1$, the first scaling factor rsc1<k> stored in memory module 509 is applied to the gain residue at step 710, such that $W_{DIN}=\text{rsc1<k>}*(W_{DIN}-W_k)$. At step 711 the counter k is set to $N_b$ and the method proceeds to step 712.

If, at step 712, the gain residue is less than 0, the method proceeds to step 713 where the kth element of the raw DAC input code $D_k$ is set to 0 and the counter k decremented. Otherwise, the method proceeds to step 714 where the kth element of the raw DAC input code $D_k$ is set to 1 and the counter k decremented. The method then returns to step 712 and repeats steps 712 and steps 713 or 714 until it is determined that k<1 at step 715, indicating all k elements of the DAC input code $D_{in}$ have been processed.

Once all k elements have been processed, in step 716 the converted digital input signal $D_{cal}$ is provided to the segmented non-binary DAC 200.

Figure 8:
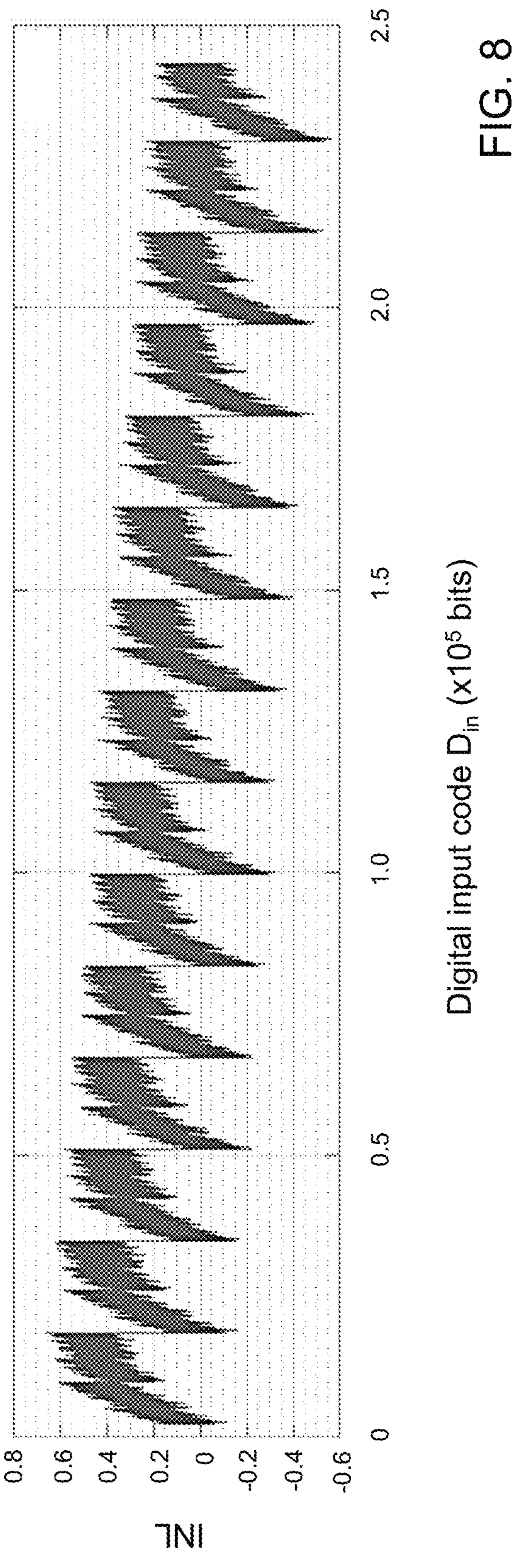
FIG. 8 is an example plot of INL as a function of digital input code for the self-calibrating DAC system of FIG. 5.

FIG. 8 illustrates a simulated plot of INL as a function of digital input code following a self-calibration process as described above for an 18 bit DAC with polysilicon resistors. It can be seen that the INL for the DAC is improved significantly as compared to the prior results illustrated in FIG. 4.

It is also possible to evaluate other scaling factors for regions 3 and 4 in a similar way to that for regions 1 and 2. These scaling factors can also be applied during code-conversion to improve the INL further.

From reading the present disclosure, other variations and modifications will be apparent to the skilled person. Such variations and modifications may involve equivalent and other features which are already known in the art of DAC systems, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A method for calibrating non-linearity of a segmented non-binary DAC in a self-calibrating DAC system, the segmented non-binary DAC having a thermometric weighted segment having a first plurality of switches and resistive elements controllable by a most significant plurality of bits of a digital input signal and a sub-binary weighted segment having a second plurality of switches and resistive elements controllable by a least significant plurality of bits of the digital input signal, the method comprising:

providing a first cumulative series of calibration input digital signals to the thermometric weighted segment and measuring a corresponding first series of outputs of the DAC with an ADC;

providing a second non-cumulative series of calibration input digital signals to the thermometric weighted segment and measuring a second series of outputs of the DAC with the ADC;

calculating a first scaling factor for the first plurality of switches and resistive elements by dividing each of the second series of outputs of the DAC by a difference between adjacent ones of the first series of outputs of the DAC;

calculating a second scaling factor for the second plurality of switches from a sum of the first series of outputs of the DAC divided by a measured output range of the DAC; and storing the first and second scaling factors in a memory module of the self-calibrating DAC system for applying to a digital input during normal operation of the DAC system.

2. The method of claim 1, wherein the first scaling factor rsc1<i> is calculated as $$rsc1\langle i\rangle = \frac{Wnc\langle i+1\rangle}{W\langle i+1\rangle - W\langle i\rangle}$$

where $W_{nc}$<i> is an output measuring a non-cumulative weight of element i of the thermometric weighted segment, $W\langle i\rangle$ is an output measuring a cumulative weight of i elements of the thermometric weighted segment, and i ranges from 1 to $N_{th}$, where $N_{th}$ is the first plurality of switches.

3. The method of claim 1, wherein the second scaling factor rsc2 is calculated as:

$$rsc2 = \frac{\sum_{i=1}^{Nb} Wi}{DAC_{FS} - DAC_{ZS} - W_{Nth}}$$

where Nb is a resolution of the sub-binary weighted segment of the DAC, $DAC_{ZS}$ is a zero scale output of the DAC, $DAC_{FS}$ is a full scale output of the DAC and $W_{Nth}$ is an output of the DAC with all $N_{th}$ switches of the thermometric weighted segment closed.

4. The method of claim 1, wherein the first cumulative series of calibration input digital signals are provided to the thermometric weighted segment while maintaining the least significant plurality of bits of the digital input signal at a constant value.

5. The method of claim 4, wherein the constant value is zero.

6. The method of claim 1, wherein the second non-cumulative series of calibration input digital signals are provided to the thermometric weighted segment while maintaining the least significant plurality of bits of the digital input signal at a constant value.

7. The method of claim 6, wherein the constant value is zero.

8. The method of claim 1, further comprising, during normal operation of the DAC system:

applying the first and second scaling factors to an input digital signal to provide a converted input digital signal;

providing the converted input digital signal to the segmented non-binary DAC; and providing an output analog signal from the segmented non-binary DAC.

9. The method of claim 8, wherein the first and second scaling factors are applied to the input digital signal using a successive approximation register.

10. A self-calibrating DAC system comprising:

a segmented non-binary DAC having a thermometric weighted segment having a first plurality of switches and resistive elements controllable by a most significant plurality of bits of a digital input signal and a sub-binary weighted segment having a second plurality of switches and resistive elements controllable by a least significant plurality of bits of the digital input signal;

an ADC configured to selectively receive an output from the DAC;

a memory module;

an input code conversion module configured to apply a scaling factor stored in the memory module to a digital input during normal operation of the DAC system; and a calibration controller configured to:

provide a first cumulative series of calibration input digital signals to the thermometric weighted segment and measure a corresponding first series of outputs of the DAC with the ADC;

provide a second non-cumulative series of calibration input digital signals to the thermometric weighted segment and measure a second series of outputs of the DAC with the ADC;

calculate a first scaling factor for the first plurality of switches and resistive elements by dividing each of the second series of outputs of the DAC by a difference between adjacent ones of the first series of outputs of the DAC;

calculate a second scaling factor for the second plurality of switches from a sum of the first series of outputs of the DAC divided by a measured output range of the DAC; and store the first and second scaling factors in the memory module.

11. The system of claim 10, wherein the calibration controller is configured to calculate the first scaling factor rsc1<i> from:

$$rsc1\langle i\rangle = \frac{Wnc\langle i+1\rangle}{W\langle i+1\rangle - W\langle i\rangle}$$

where $W_{nc}$<i> is an output measuring a non-cumulative weight of element i of the thermometric weighted segment, $W_{nc}\langle i\rangle$ is an output measuring a cumulative weight of i elements of the thermometric weighted segment, and i ranges from 1 to $N_{th}$, where $N_{th}$ is the first plurality of switches.

12. The system of claim 10, wherein the calibration controller is configured to calculate the second scaling factor rsc2 from:

$$rsc2 = \frac{\sum_{i=1}^{Nb} Wi}{DAC_{FS} - DAC_{ZS} - W_{Nth}}$$

where $N_{th}$ is the first plurality of switches, Nb is a resolution of the sub-binary weighted segment of the DAC, $DAC_{ZS}$ is a zero scale output of the DAC, $DAC_{FS}$ is a full scale output of the DAC and $W_{Nth}$ is an output of the DAC with all $N_{th}$ switches of the thermometric weighted segment closed.

13. The system of claim 10, wherein the calibration controller is configured to provide the first cumulative series of calibration input digital signals to the thermometric weighted segment while maintaining the least significant plurality of bits of the digital input signal at a constant value.

14. The system of claim 13, wherein the constant value is zero.

15. The system of claim 10, wherein the calibration controller is configured to provide the second non-cumulative series of calibration input digital signals to the thermometric weighted segment while maintaining the least significant plurality of bits of the digital input signal at a constant value.

16. The system of claim 15, wherein the constant value is zero.

17. The system of claim 10, wherein the input code conversion module is configured to apply the first and second scaling factors to the input digital signal using a successive approximation register.

18. A computer program comprising instructions to cause a computer processor to perform a method of calibrating non-linearity of a segmented non-binary DAC in a self-calibrating DAC system, the segmented non-binary DAC having a thermometric weighted segment having a first plurality of switches and resistive elements controllable by a most significant plurality of bits of a digital input signal and a sub-binary weighted segment having a second plurality of switches and resistive elements controllable by a least significant plurality of bits of the digital input signal, the method comprising:

providing a first cumulative series of calibration input digital signals to the thermometric weighted segment and measuring a corresponding first series of outputs of the DAC with an ADC;

providing a second non-cumulative series of calibration input digital signals to the thermometric weighted segment and measuring a second series of outputs of the DAC with the ADC;

calculating a first scaling factor for the first plurality of switches and resistive elements by dividing each of the second series of outputs of the DAC by a difference between adjacent ones of the first series of outputs of the DAC;

calculating a second scaling factor for the second plurality of switches from a sum of the first series of outputs of the DAC divided by a measured output range of the DAC; and storing the first and second scaling factors in a memory module of the self-calibrating DAC system for applying to a digital input during normal operation of the DAC system.

19. The computer program of claim 18, wherein the instructions cause the first scaling factor rsc1<i> to be calculated as:

$$rsc1\langle i\rangle = \frac{Wnc\langle i+1\rangle}{W\langle i+1\rangle - W\langle i\rangle}$$

where $W_{nc}<i>$ is an output measuring a non-cumulative weight of element i of the thermometric weighted segment, $W_{nc}\langle i\rangle$ is an output measuring a cumulative weight of i elements of the thermometric weighted segment, and i ranges from 1 to $N_{th}$, where $N_{th}$ is the first plurality of switches.

20. The computer program of claim 18, wherein the instructions cause the second scaling factor rsc2 to be calculated as:

$$rsc2 = \frac{\sum_{i=1}^{Nb} Wi}{DAC_{FS} - DAC_{ZS} - W_{Nth}}$$

where Nb is a resolution of the sub-binary weighted segment of the DAC, $DAC_{ZS}$ is a zero scale output of the DAC, $DAC_{FS}$ is a full scale output of the DAC and $W_{Nth}$ is an output of the DAC with all $N_{th}$ switches of the thermometric weighted segment closed.

* * * * *